(12) United States Patent
Shannon et al.

(10) Patent No.: US 8,238,068 B2
(45) Date of Patent: Aug. 7, 2012

(54) ELECTRICAL OVER-STRESS DETECTION CIRCUIT

(75) Inventors: Donelson Arthur Shannon, Austin, TX (US); Alan Lee Westwick, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 180 days.

(21) Appl. No.: 12/766,301

(22) Filed: Apr. 23, 2010

(65) Prior Publication Data

US 2010/0271742 A1    Oct. 28, 2010

Related U.S. Application Data

(60) Provisional application No. 61/172,595, filed on Apr. 24, 2009.

(51) Int. Cl.
*H02H 9/00* (2006.01)
(52) U.S. Cl. .......................................................... 361/56
(58) Field of Classification Search ...................... 361/56
See application file for complete search history.

(56) References Cited

U.S. PATENT DOCUMENTS

| | | | |
|---|---|---|---|
| 5,784,242 A | 7/1998 | Watt | |
| 5,946,175 A | 8/1999 | Yu | |
| 6,249,410 B1 | 6/2001 | Ker et al. | |
| 6,411,544 B1* | 6/2002 | Devin | 365/185.01 |
| 6,819,539 B1* | 11/2004 | Wright et al. | 361/90 |
| 7,142,400 B1* | 11/2006 | Williams et al. | 361/18 |
| 7,593,202 B2 | 9/2009 | Khazhinsky et al. | |
| 7,630,184 B2 | 12/2009 | Crain et al. | |
| 2004/0027159 A1 | 2/2004 | Oertle et al. | |
| 2005/0127953 A1 | 6/2005 | Oertle et al. | |
| 2008/0074817 A1 | 3/2008 | Crain et al. | |
| 2008/0297939 A1* | 12/2008 | Amemiya | 360/75 |
| 2010/0271742 A1* | 10/2010 | Shannon et al. | 361/56 |

* cited by examiner

*Primary Examiner* — Ronald W Leja
(74) *Attorney, Agent, or Firm* — Cesari & Reed, LLP; R. Michael Reed

(57) ABSTRACT

In an embodiment, an electrical over-stress (EOS) circuit includes a detection circuit coupled between first and second supply terminals and configured to detect a perturbation in a supply voltage potential between the first and second supply terminals or between a supply voltage potential and a pad voltage of a bond pad. The EOS circuit further includes an alert generation circuit configured to store data indicating an EOS event in response to detecting the perturbation.

21 Claims, 4 Drawing Sheets

ELECTRICAL OVER-STRESS DETECTION CIRCUIT

CROSS-REFERENCE TO RELATED APPLICATION(S)

This application is a non-provisional patent application of and claims priority from U.S. Provisional Patent Application No. 61/172,595 entitled "ESD/EOS Detection Circuit and Method" filed on Apr. 24, 2009, which is incorporated herein by reference in its entirety.

FIELD

The present disclosure is generally related to integrated circuits, and more particularly to electrical over-stress detection circuits for integrated circuits.

BACKGROUND

Electronic circuits can be susceptible to damage or operational failure as a result of Electrostatic Discharge (ESD) events or Electrical Over-stress (EOS) events that occur on their terminals. An ESD event or an EOS event may occur, for example, when a user who has accumulated electrostatic charge picks up the integrated circuit, touches an exposed pin, or, for example, interacts with a touch pad coupled to the integrated circuit. As used herein, the term "ESD event" refers to a transient surge of energy, which may be as high as a few thousand volts, that appears across the terminals of the integrated circuit. As used herein, the term "EOS event" refers to a rapid change in energy that appears on terminals of the integrated circuit, which change may be greater than an application-specific threshold and which can cause an observable change in the behavior of the circuit. While EOS events can be produced through user interactions with the circuit, EOS events can also be created within the chip itself, such as through switching activity of a large input/output driver circuit. Regardless of the source, such EOS events may disrupt operation of the circuit (such as by corrupting measurement data) or may cause long term damage by over-stressing sensitive circuitry.

Most integrated circuits incorporate ESD protection structures that are coupled to input/output (I/O) pins and to the power supply terminals to protect other circuit structures on the integrated circuit. Such ESD protection structures are designed to activate in response to a transient voltage in excess of a pre-determined energy threshold, which is usually at a voltage level that is below a voltage rating for associated circuitry. In a particular example, if a logic circuit of the integrated circuit is rated to withstand voltages up to approximately 7.0 volts, the ESD energy threshold would be set at a level below 7.0 volts, so that the ESD protection structure is activated to clamp the voltage before the voltage rises to a level that would damage the other circuitry. It should be understood that the above numbers are illustrative only, and that other voltages, both lower and significantly higher, may be used as thresholds in such circuits. In many instances, such ESD protection structures operate to clamp the input voltage at a pre-configured voltage level and to divert excess energy from the ESD event to one of the power supply terminals in order to prevent damage to the circuitry from such high-energy transients.

EOS discharges below the ESD threshold level may not activate the ESD protection structure. However, the elevated voltage and/or current peaks associated with these discharges can nevertheless disrupt circuit operation and may damage associated circuitry. Circuit functions that involve the generation or measurement of very small voltages or currents, such as analog-to-digital converters, are particularly susceptible to corruption from such EOS events. Such corruption can include short-term disruption of measurement data and/or permanent damage to measurement circuitry due to over-stress. Furthermore, it can be very difficult to determine when such corruption occurs, since the EOS-induced perturbation in the integrated circuit's output may be similar to one caused by a valid change to an analog input signal.

SUMMARY

In an embodiment, an electrical over-stress (EOS) circuit includes a detector coupled to first and second supply terminals and configured to detect a perturbation in a supply voltage potential between the first and second supply terminals. The EOS circuit further includes an alert generator configured to store data indicating an EOS event in response to the detection circuit detecting the perturbation.

In another embodiment, a circuit includes an electrostatic discharge (ESD) protection circuit for detecting a voltage potential that exceeds an ESD threshold between first and second supply terminals. The circuit further includes an electrical over-stress (EOS) detector configured to detect a perturbation in the voltage potential that is greater than a pre-determined threshold and, in response to detecting the perturbation, to store in a storage element data indicating an EOS event in response to detecting the perturbation in a storage element.

In still another embodiment, a system includes a first supply terminal, a second supply terminal, and a circuit coupled between the first and second supply terminals. The circuit is sensitive to perturbations in a voltage potential between the first and second supply terminals. The system further includes an electrostatic discharge (ESD) protection circuit configured to detect an ESD event when the voltage potential between the first and second supply terminals exceeds an ESD threshold. The ESD protection circuit is configured to shunt excess current between the first and second supply terminals and to clamp the voltage potential at a pre-determined voltage level in response to detecting the ESD event. The system also includes an electrical over-stress (EOS) circuit including an EOS detector and a storage element. The EOS detector is configured to detect a perturbation in the voltage potential that is greater than an EOS threshold and, in response to detecting the perturbation, to store in the storage element data indicating detection of an EOS event.

Figure 1:
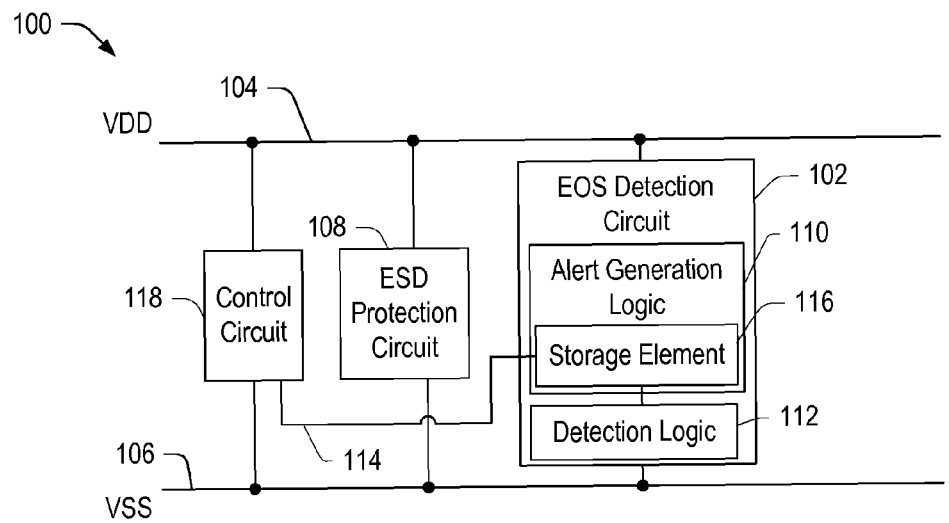
FIG. 1 is a simplified block diagram of an embodiment of a portion of an integrated circuit including an EOS detection circuit.

In the following description, the use of the same reference numerals in different drawings indicates similar or identical items. Further, it should be understood that the drawings are provided for illustrative purposes only. In the illustrated embodiments, direct connections between components are illustrative and it should be understood that such illustrated connections may include intervening elements that are not shown.

DETAILED DESCRIPTION OF ILLUSTRATIVE EMBODIMENTS

Exemplary embodiments of an EOS detection circuit are described below that are configured to determine when an EOS event has occurred and to produce an output signal in response to detecting the EOS event. The output signal can be a digital signal that can be stored by a storage element, allowing a control circuit coupled to the storage element to process the EOS event, such as applying appropriate filtering to output values or sets of output values, discarding potentially corrupted data, and so on.

In the following discussion of the illustrated embodiments, various elements are depicted as being connected to one another. However, it should be understood that the various embodiments may include additional circuit elements (not shown) through which such connections are made. Accordingly, in the following discussion, the term "coupled" includes, but is broader than, a direct connection.

FIG. 1 is a block diagram of an embodiment of a portion of an integrated circuit 100 including an EOS detection circuit 102. Circuit 100 includes a first supply terminal 104 and a second supply terminal 106. Circuit 100 further includes an electrostatic discharge (ESD) protection circuit 108, and a control circuit 118. ESD protection circuit 108, EOS detection circuit 102, and control circuit 108 are coupled between first and second supply terminals 104 and 106.

Circuit 100 may include other circuitry, such as discrete circuit components and integrated circuits. Such circuitry is typically designed to withstand voltages up to a maximum threshold for the particular component or circuit. Such a maximum threshold is typically determined based on the lowest voltage rating of any of the components of the circuit. ESD protection circuit 108 is configured to detect a power surge in excess of an ESD threshold, which is less than the maximum threshold, and to clamp or limit a voltage potential between the first and second supply terminals to a desired level until the transient event is over and the excess energy is dissipated. In particular, the ESD protection circuit 108 may shunt excess current between the first and second supply terminals 104 and 108 and clamp the voltage at a level that corresponds to one or more diode voltage drops.

EOS detection circuit 102 includes detection circuit 112 configured to detect a perturbation in the voltage potential between the first and second supply terminals 104 and 106. Such a perturbation may be any variation in the voltage potential, including variations that are equal to or that exceed a pre-determined threshold, which may be less than the ESD threshold. In some instances, detection circuit 112 may be configured to detect variations that are as small as or smaller than a single diode voltage drop.

EOS detection circuit 102 further includes alert generation logic 110, which is responsive to detection circuit 112 to store a value indicating detection of the perturbation. Alert generation logic 110 includes a storage element 116, which is coupled to an output terminal 114. In some instances, alert generation logic 110 changes from a first state to a second state in response to detection of the perturbation, and is returned to its first state, for example, by a reset signal from control circuit 118.

Storage element 116 may be a memory device, a register, a latch, a counter, or other data storage element or circuit, which is configured to store one or more values indicative of an EOS event. In some instances, storage element 116 may be configured to retain a log or history of perturbation events, which log or history may be accessed to retrieve data for analysis. Storage element 116 is coupled to control circuit 118 by output terminal 114. In an embodiment, storage element 116 stores a status bit, which can be used as an interrupt for control circuit 118. In this instance, control circuit 118 may periodically poll the output terminal 114 to determine the value of the status bit and may perform some operation in response to a status bit indicating the detection of a perturbation. In some instances, the perturbation may be caused by a change in an analog signal, and control circuit 118 may be configured to perform various functions to determine the cause of the perturbation. In other instances, control circuit 118 may reset various measurements or perform other operations in response to the status bit. Once the operations are performed, control circuit 118 resets the memory element 116.

Figure 2:
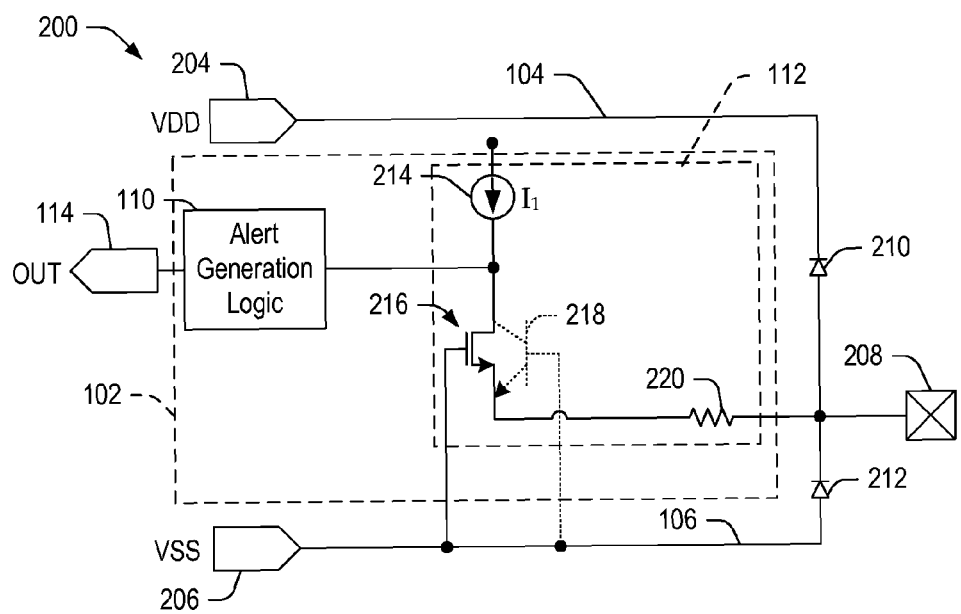
FIG. 2 is a simplified schematic diagram of a circuit including an embodiment of the EOS detection circuit of FIG. 1.

In operation, detection circuit 112 detects a perturbation in the voltage potential between the first and second supply terminals 104 and 106 or between one of the first and second supply terminals 104 and 106 and a bond pad, such as the bond pad 208 depicted in FIG. 2. Alert generation logic 110 stores data related to the perturbation in storage element 116, which stores the data even after the perturbation is removed, allowing time for control circuit 118 to notice that a perturbation was detected. Since transient events occur quickly and dissipate rapidly, storage element 116 retains information related to a detected perturbation, allowing time for the control circuit 118 to detect and evaluate the event.

It should be noted that the ESD threshold is typically much greater than the EOS threshold, which makes it possible for the EOS detection circuit 102 to store data from EOS events that may be too small to activate the ESD protection circuitry, but which nevertheless may damage sensitive circuitry or cause circuitry to produce an incorrect output. Additionally, the ESD threshold is typically determined by the associated circuitry, whereas the pre-determined EOS threshold may be application-specific. In some instances, the EOS threshold may be programmed, such as by providing a programmable reference current source (such as the current sources depicted in FIGS. 6 and 7 below.

While the illustrated circuit 100 does not show a bond pad, bond pads, pins, and other conductive leads can be sources of ESD and EOS events. Such bond pads may be coupled to ESD protection circuit 108 through first and second supply terminals 104 and 106. In some implementations, EOS detection circuit 102 may also be coupled to such a bond pad to detect EOS events. One example of circuit including EOS detection circuit 102 coupled to a bond pad for detecting an EOS event is described below with respect to FIG. 2.

FIG. 2 is a schematic diagram of a circuit 200 including an embodiment of the EOS detection circuit 102 of FIG. 1.

Circuit 200 includes supply pins 204 and 206 coupled to supply terminals 104 and 106, respectively. Supply pin ($V_{DD}$) 204 carries a voltage that is positive relative to a voltage on supply pin ($V_{SS}$) 206. Additionally, circuit 200 includes diodes 210 and 212 coupled in series between supply terminals 104 and 106. The anode of diode 212 is coupled to supply terminal 106 and the cathode is coupled to a bond pad 208. The anode of diode 210 is coupled to bond pad 208 and the cathode is coupled to supply terminal 104.

Diodes 210 and 212 form part of the ESD protection circuit 108 and may be formed from the drain-to-bulk junctions of metal oxide semiconductor field effect transistors (MOSFETs) or may be implemented as separate devices. Diodes 210 and 212 will shunt high current from an ESD or EOS event on the bond pad 208 to the supply terminals 104 and 106. For example, an EOS discharge that is negative with respect to a ground supply voltage will cause diode 212 to turn on, preventing the voltage on bond pad 208 from falling to a negative voltage level that might damage circuit 200. Resistor 220 isolates internal circuits from EOS events on the bond pad 208 by ensuring that the high currents flow through diodes 212 and 210, which are designed to withstand high transient current levels. A typical "on" voltage across diode 212 may be around 0.6V at moderate currents, but could exceed 1V during high-energy EOS events.

EOS detection circuit 102 includes a current source 214 coupled to supply terminal 104 and configured to provide a current ($I_1$) to a drain of a transistor 216, which is an n-channel MOSFET. Transistor 216 further includes a gate coupled to supply terminal 106 and a source coupled to bond pad 208 through resistor 220. Resistor 220 includes a first terminal coupled to bond pad 208 and a second terminal coupled to the source of transistor 216. Further, EOS detection circuit 102 includes a parasitic transistor 218, which is an NPN bipolar junction transistor that is an integral part of transistor 216, with its collector, base, and emitter formed from the n-doped drain, p-doped bulk, and n-doped source regions of transistor 216, respectively.

In operation, in a normal state, transistor 216 and parasitic transistor 218 are turned off (i.e. nonconductive), and current source 214 will pull up a voltage on the drain of transistor 216 to voltage potential of supply terminal 104, i.e., a logic high level. In response to a negative EOS discharge on the bond pad 218, the pad voltage will drop below ground until diode 212 becomes forward-biased, causing diode 212 to conduct current and clamping the pad voltage. This pad voltage will be coupled through resistor 220 to the source of transistor 216, which is also the emitter of parasitic transistor 218. The decreasing voltage potential of the source of transistor 216 and the emitter of parasitic transistor 218 will turn these devices on, causing the drain voltage at the input of the alert generation logic 110 to decrease to a level that approaches the clamped voltage level, i.e., a logic low level. Thus, the drain voltage is a digital value that represents normal operation in its high state (VDD) and that represents detection of a negative EOS event in its low state, which digital value can be stored in storage element 116 of alert generation logic 110.

In the illustrated embodiment, the conduction characteristics of transistor 216 and parasitic transistor 218, and the value of pull-up current source 214 determine the detection threshold. Since the base-emitter junction of parasitic transistor 218 would normally be formed from the same types of doped semiconductor regions as are used for p-n junction of diode 212, and since the voltage potentials across those two junctions would be substantially the same (assuming that the current in parasitic transistor 218 is low enough that the voltage drop across resistor 220 is negligible), then the base-emitter current of parasitic transistor 218 will be proportional to the current in diode 212, with the proportionality constant determined primarily by the ratio the effective p-n junction areas of the two devices. For a given current value, the voltage across diode 212 is a strong function of temperature; however, the base-emitter junction of parasitic transistor 218 will have a matching temperature characteristic, so that the current ratio between diode 212 and parasitic transistor 218 will be substantially independent of temperature. The collector current of parasitic transistor 218 is proportional to the base current, and can be calculated according to the following equation:

$$I_c = \beta \times I_b \quad (1)$$

In Equation 1, the collector current ($I_c$) is proportional to the base current ($I_b$) of the parasitic transistor 218 based on beta ($\beta$) in the forward-active region. Further, the contribution of parasitic transistor 218 to the total pull-down current is determined primarily by the junction area of diode 212, the base-emitter junction area of parasitic transistor 218, and the beta of parasitic transistor 218, provided that the current is low enough to neglect the effect of resistor 220.

Transistor 216 will provide a pull-down current in parallel to that of parasitic transistor 218. The width-to-length (W/L) ratio of transistor 216 and its threshold voltage ($V_T$) largely determine the magnitude of the pull-down current. A typical N-channel MOSFET used inside a circuit having a bond pad 218 may have a threshold voltage of around 0.7V at room temperature. If transistor 216 is produced in a similar manner, transistor 216 may not become conductive until diode 212 is conducting a large current. However, the fact that the source of transistor 216 will be at a lower potential than the bulk terminal means that the effective threshold voltage of transistor 216 will be reduced by the back-gate effect, and the effective threshold voltage of transistor 216 may be comparable to or even below the voltage at which diode 212 conducts substantial current.

By appropriate choice of the W/L ratio of transistor 216, the emitter area of parasitic transistor 218, and the size of the pull-up current ($I_1$), it is possible to adjust the switching point of the input to alert generation logic 110 on the drain of transistor 216 over a wide range, so that the circuit 200 may be designed with high sensitivity (to detect very small currents flowing through diode 212), with low sensitivity (so that the output signals switches only upon detection of large EOS events), or with any desired threshold. A circuit 200 configured with high sensitivity would be able to detect a wide range of interfering events, such as low-level interference from noise sources via capacitive, inductive, or electromagnetic coupling, but may result in a larger number of false alarms. Such false alarms can be filtered out by control circuit 118 either through testing of various parameters, by reviewing other values stored in storage element 116, or through various filters.

It is also possible to provide adjustable sensitivity by making any of those parameters programmable in response to an analog control signal or a digital control word. For example, current source 214 may be implemented as a programmable current source. Current source 214 can be implemented as an active current source or as a resistor, either of which can be made to have programmable values. Adjustable sensitivity can be used to tune circuit 200 for specific sources of interference or to compensate for manufacturing-induced variations, supply-induced variations, or temperature-induced variations in components of EOS detection circuit 102.

Figure 3:
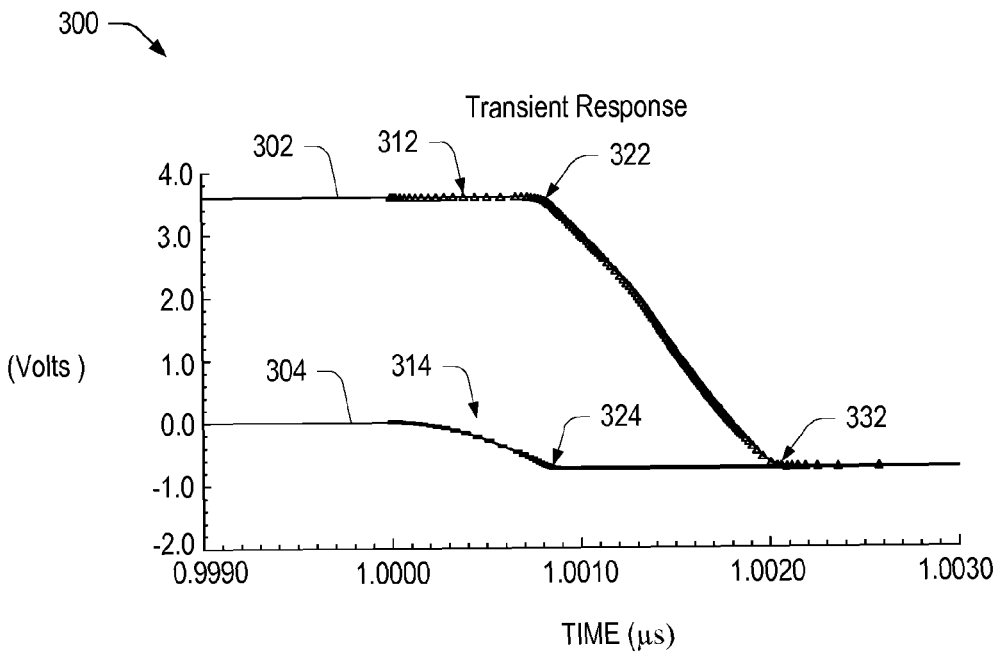
FIG. 3 is a graph of voltage versus time for an input voltage at an input/output bond pad and for an output voltage at an output of the EOS detection circuit for an EOS event that forces the pad voltage to drop below a voltage potential of a negative supply terminal.

In the illustrated embodiment, EOS detection circuit 102 pulls down the voltage on the drain of transistor 216 when a pad voltage on bond pad 208 is negative relative to the supply potential of supply terminal 106 by at least one diode voltage drop of diode 212. In particular, the threshold voltage of diode 212 operates as a perturbation detection threshold for EOS detection circuit 102. FIG. 3 shows representative example waveforms on bond pad 208 and on the drain of transistor 216 during a representative EOS event, which illustrates the diode 212 operating as an EOS threshold.

FIG. 3 is a graph 300 of voltage versus time of an input voltage 304 at bond pad 208 and an output voltage 302 at the drain of transistor 216 of EOS detection circuit 102 for an EOS event that forces the pad voltage to drop below a voltage on supply terminal 106. When an EOS event occurs at 314, a negative voltage is applied to bond pad 208. The pad voltage on bond pad 208 decreases from ground until diode 212 is forward biased, causing diode 212 to conduct current at 314 until the voltage on bond pad 208 is clamped by diode 212 at 324. The drain voltage of transistor 216 that is provided to output 114 remains at a high state at 312 while diode 212 begins conducting, and then changes from the high state to a low state, starting at 322 when the pad voltage decreases below the threshold (i.e., a threshold voltage of diode 212) of EOS detection circuit 102. Output voltage 302 may decrease to the clamped voltage level at 332, approximately 0.0020 microseconds after the start of the EOS event.

While circuit 200 can be adjusted by programming various parameters, sensitivity can also be enhanced by incorporating a capacitor between the bond pad 208 and the drain of transistor 216. An example of an alternative circuit that includes such a capacitor is described below with respect to FIG. 4.

Figure 4:
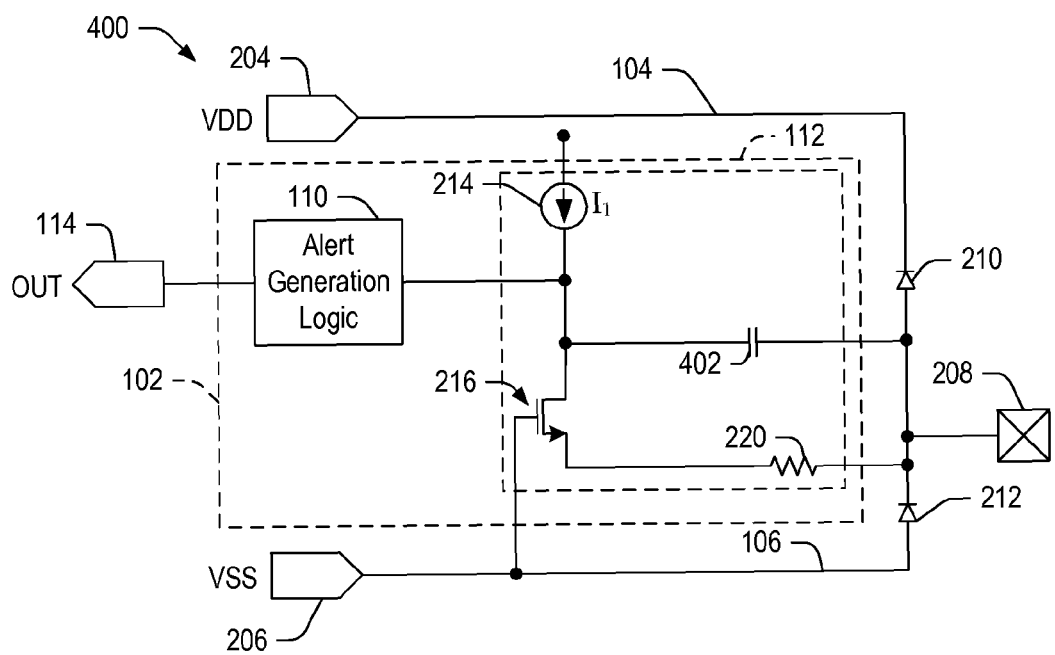
FIG. 4 is a simplified schematic diagram of a circuit including a second embodiment of the EOS detection circuit of FIG. 1.

FIG. 4 is a schematic diagram of a second embodiment of a circuit 400 including the EOS detection circuit 102 of FIG. 1. This embodiment of EOS detection circuit 102 is the same as that described above with respect to FIG. 2, except that a capacitor 402 is added that is coupled between bond pad 208 and the drain of transistor 216, which is also coupled to output 114.

In operation, capacitor 402 serves as a parallel current path to couple fast transient events on bond pad 208 to the drain of transistor 216, which is the input to alert generation logic 110. Coupling transients directly to the input of alert generation logic 110 provides an additional opportunity for adjusting the sensitivity of the EOS detection circuit 102 or for tailoring the sensitivity of EOS detection circuit 102 to detect EOS events having a specific set of characteristics. In particular, AC transients can be shunted to the output terminal 114 even before the diodes 212 and 210 begin conducting, and alert generation logic 110 can capture such transients to provide an early interrupt for control circuit 118.

Embodiments of the EOS detection circuit 102 shown in FIGS. 1, 2, and 4 uses an N-channel MOSFET that will detect EOS events that produce a drop in the pad voltage on bond pad 208 that fall below the voltage potential on supply terminal 106 by more than a diode voltage drop across diode 212. In the circuit 400 of FIG. 4, EOS detection circuit 102 is also configured to capture fast transients that fall below ground. However, it may be desirable to detect increases in the pad voltage that rise above the positive supply rail. A complementary circuit (such as a P-channel MOSFET) can be used to detect EOS events that cause the pad voltage to rise above the VDD potential. One example of such a circuit is discussed below with respect to FIG. 5.

Figure 5:
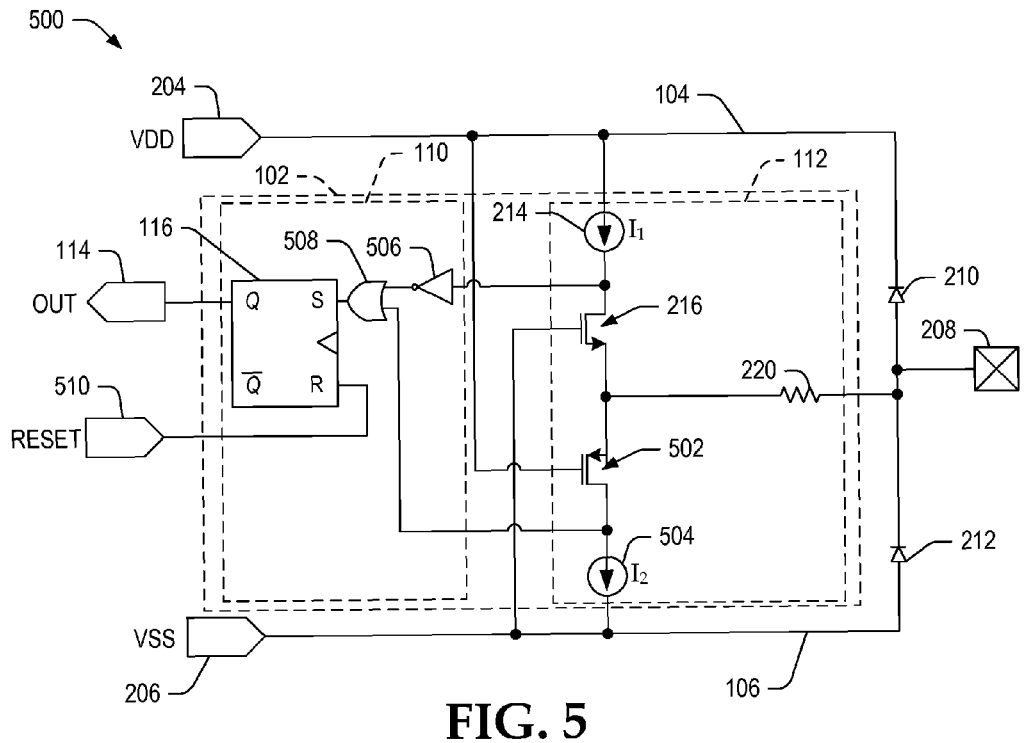
FIG. 5 is a simplified schematic diagram of a circuit including a third embodiment of the EOS detection circuit of FIG. 1.

FIG. 5 is a schematic diagram of a circuit 500 including third embodiment of the EOS detection circuit 102 of FIG. 1. The illustrated embodiment of the EOS detection circuit 102 of circuit 500 includes the components discussed above with respect to FIG. 2 and includes a PMOS transistor 502 and a second current source 504 to provide a second current ($I_2$). PMOS transistor 502 includes a source coupled to the source of NMOS transistor 216 and to resistor 220. PMOS transistor 502 further includes a gate coupled to supply terminal 104 and a drain coupled to current source 504.

In this instance, transistors 216 and 502 cooperate to sense pad voltages that are below ground or above a positive supply rail. PMOS transistor 502 has an inherent parasitic PNP bipolar junction transistor (not shown) formed in the same manner as the NPN transistor 218 associated with NMOS transistor 216. NMOS transistor 216 detects negative perturbations (i.e., perturbations that are more negative than the negative supply potential) and PMOS transistor 502 detects perturbations that are greater than the positive supply potential). The positive and negative detectors can have separate digital outputs corresponding to the voltages on their respective drains, but to minimize circuit area and routing, the outputs of the two detectors may be combined into a single digital output using logic circuitry included in alert generation circuit 110 to provide a single input to storage element 116.

In the illustrated embodiment, one possible implementation of alert generation logic 110, including logic circuitry to combine the digital outputs to produce a single digital output, is depicted. Alert generation circuit 110 includes an inverter 506 having an input coupled to the drain of transistor 216 and having an output coupled to a first input of a logical OR gate 508. OR gate 508 further includes a second input coupled to the drain of PMOS transistor 502 and includes an output coupled to a data input of a storage element 116. Storage element 116 includes a reset input coupled to reset pin 510 and an output coupled to output terminal 114. Storage element 116 also includes a clock input for receiving a clock signal (not shown). Since many EOS events are very fast, it may be desirable to capture (latch) the output of EOS detection circuit 102 to give the system (such as a control circuit) time to respond appropriately.

Once the system has acknowledged the EOS event, the system (or control circuit) applies a signal to reset pin 512 to clear (reset) storage element 116 to resume EOS detection. In one embodiment, the system is a microcontroller unit (MCU), and the output of storage element 116 could be made available as a register bit that could be polled by software, or it could serve as a hardware interrupt. The MCU would clear the bit after processing the interrupt.

In some embodiments, it may be advantageous to combine the outputs of a plurality of EOS detection circuits 102 into a single interrupt source in order to reduce circuit size and complexity. In such a case, information about which pad suffered the EOS event may be lost. However, in many situations it is actually the high current flowing through the supply terminals 104 and 106 (which may be VDD and ground lines) that causes the most significant circuit malfunction. In such instances, it may not be important for the system to determine which specific I/O pad introduced the EOS energy.

The system may use the interrupt or EOS event detection signal in a variety of ways, depending on the context. In one instance, upon receipt of the EOS detection signal from storage element 116, the system is configured to flush recent measurement data or other data sensitive to EOS perturbations. In other instances, the system is configured to apply filters to such data to correct for any such perturbations, for example by interpolating the measurement data with respect to other measurements. In still other instances, the system is configured to run diagnostics to determine whether any circuitry sustained permanent damage due to the EOS event. In an embodiment, control circuit 118 may use historical data retrieved from storage element 116 to produce filters for processing EOS events.

In the illustrated embodiments of EOS detection circuit 102 depicted in FIGS. 2, 4, and 5, only one circuit is shown. However, it should be appreciated that detection thresholds of EOS detection circuit 102 are programmable, and that, within an integrated circuit, additional detection circuits may be included that are programmed to have different thresholds.

Further, while the embodiments of EOS detection circuit 102 depicted in FIGS. 2, 4, and 5 detect EOS events that exceed a threshold that corresponds to a diode voltage drop across either diode 212 or diode 210, it is possible to detect smaller perturbations. In some instances, it may be desirable to detect EOS events that are less than a diode voltage drop. One example of a circuit to provide such high sensitivity to EOS events is described below with respect to FIG. 6.

Figure 6:
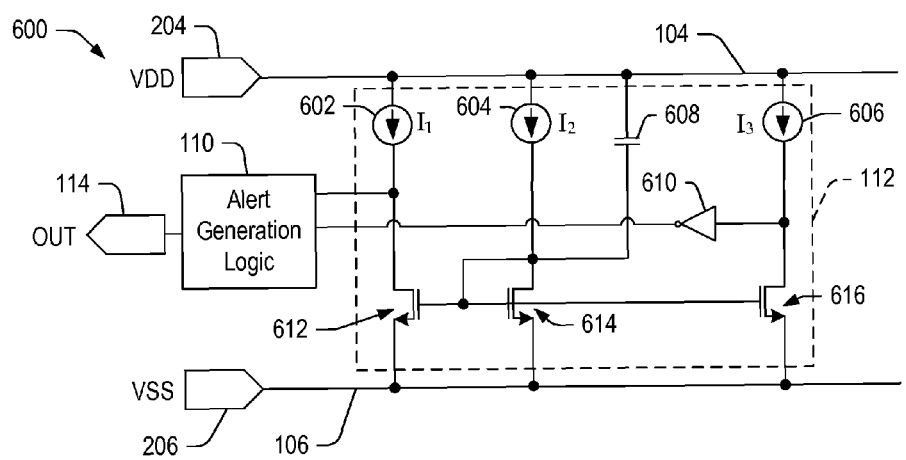
FIG. 6 is a simplified schematic diagram of a circuit including a fourth embodiment of the EOS detection circuit of FIG. 1.

FIG. 6 is a schematic diagram of a circuit 600 including a fourth embodiment of the EOS detection circuit 102 of FIG. 1. In this embodiment, EOS detection circuit 102 includes current sources 602, 604, and 606 and transistors 612, 614, and 616, which are n-channel MOSFETs. First current source 602 is coupled to supply terminal 104 and is configured to provide a first current ($I_1$) to a drain of transistor 612, which includes a gate and includes a source coupled to supply terminal 106. Second current source 604 is coupled to supply terminal 104 and is configured to provide a second current ($I_2$) to a drain of transistor 614, which includes a gate coupled to the gate of transistor 612 and includes a source coupled to supply terminal 106. Third current source 606 is coupled to supply terminal 104 and is configured to provide a third current ($I_3$) to a drain of transistor 616, which includes a gate coupled to the gate of transistor 612 and includes a source coupled to supply terminal 106. EOS detection circuit 102 further includes a capacitor 608, which includes a first electrode coupled to supply terminal 104 and a second electrode coupled to the gates of transistors 612, 614, and 616. Additionally, the drains of transistors 612 and 616 are coupled to first and second inputs, respectively, of alert generation logic 110. The first input of alert generation logic 110 may be inverted (as illustrated by inverter 610).

In operation, transistor 614 is diode-coupled to provide a reference current. In one embodiment, transistors 612 and 616 may be sized in order to allow more or less current to flow in response to the same applied gate voltage. When the potential difference between the voltages on the positive and negative supply terminals 104 and 106 is constant or changes very slowly, circuit 600 will be in a balanced state. In one embodiment, the currents I1, I2, and I3 are substantially equal, and the W/L ratio of transistor 612 is larger than that of transistor 614, while the width-to-length (W/L) ratio of transistor 616 is smaller than that of transistor 614. In response to such a substantially constant or slowly changing voltage, transistor 612 will conduct more current than transistor 614, and therefore the drain of transistor 612 will stay near the negative supply voltage. Conversely, transistor 616 will conduct less current than transistor 614, so the drain of transistor 616 will be pulled high by current source 606. The logic high level at the drain of transistor 616 will be inverted by inverter 610, resulting in a logic low signal provided to alert generation logic 110.

In response to a rapid increase in the positive supply voltage on supply terminal 104, the rapid increase will be passed through capacitor 608 to diode-connected transistor 614, causing a temporary increase in the currents conducted by transistors 612, 614, and 616. Since the drain of transistor 612 is already at a logic low level, an increase in the current conducted by transistor 612 will have no effect on its drain voltage. However, an increase in the drain current of transistor 616 may, if it exceeds a threshold, cause the drain of transistor 616 to change from a logic high to a logic low level. Inverter 610 will invert this logic low level to present a logic high signal to alert generation logic 110. From this description, it is apparent that a rapid decrease in the positive supply voltage can cause the voltage on the drain of transistor 612 to change from a logic low level to a logic high level. Thus, circuit 600 is capable of detecting either positive or negative perturbations in the voltage potential between supply terminals 104 and 106.

The sensitivity of circuit 600 (i.e. the detection thresholds) may be modified by adjusting the values of currents I1, I2, and I3, the value of capacitor 608, and the W/L ratios of transistors 612, 614, and 616. From this description, it should be apparent that similar behavior would be obtained by making transistors 612, 614, and 616 to be the same size, and instead by varying the values of currents $I_1$, $I_2$, and $I_3$ such that $I_1 < I_2 < I_3$.

Because of the action of capacitor 608, circuit 600 will be responsive to transient EOS events, but will not be responsive to gradual changes in supply voltage. Many circuits are designed to operate from a variety of supply voltages, or can operate from a supply voltage that changes slowly with time, such as a discharging battery. Because such a supply voltage can vary over time and over a predetermined range, it is not feasible to employ a detector with a fixed, absolute threshold voltage or voltages, since an EOS event may cause a perturbation in the supply voltage that is sufficiently large to cause harm, but which does not cause the supply voltage to exceed the predetermined acceptable operating voltage range. Therefore, circuit 600 is responsive to changes in the supply voltage potential rather than to absolute levels, providing a superior solution.

Depending on the implementation, current sources 602, 604, and 606 may be resistors, resistive networks, MOSFET devices, or more complex circuits. Depending on the implementation, the current sources 602, 604, and 606 may be programmable to allow the sensitivity to perturbations to be adjusted.

In an alternative embodiment, a resistor may be included between the gate of the diode-connected transistor 614 and the gates of transistors 612 and 616, providing a differential between the gate-to-source voltages. One example of such a circuit is described below with respect to FIG. 7.

Figure 7:
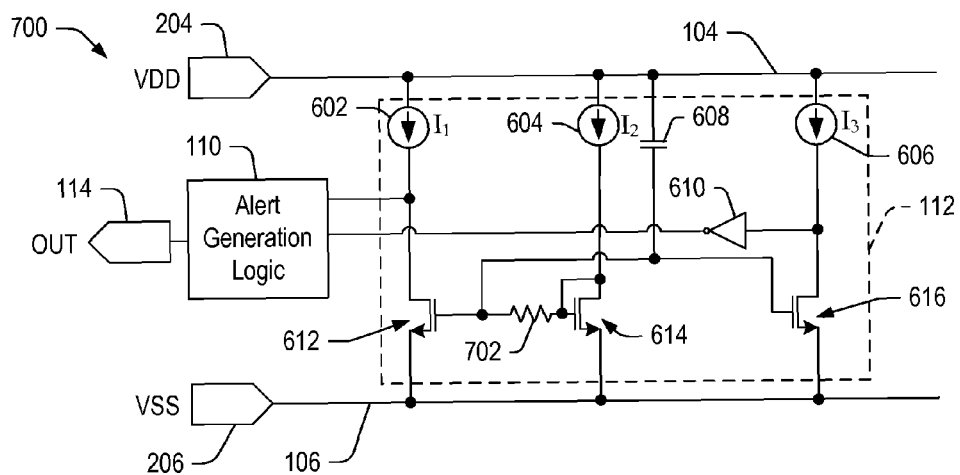
FIG. 7 is a simplified schematic diagram of a circuit including a fifth embodiment of the EOS detection circuit of FIG. 1.

FIG. 7 is a schematic diagram of a circuit 700 including a fifth embodiment of the EOS detection circuit 102 of FIG. 1. The illustrated circuit 700 is configured the same as circuit 600 in FIG. 6, except that a resistor 702 is included between the gate of transistor 614 and the gates of transistors 612 and 616. Additionally, a separate coupling is provided between the drain and the gate of transistor 614. Thus, transistor 614 is diode-connected, and the voltage on the gates of transistors 612 and 616 are related to the voltage on the drain of transistor 612 through resistor 702.

In operation, resistor 702 provides a voltage differential between the gate of transistor 614 and the gates of transistors 612 and 616. In this instance, circuit 700 operates the same as the circuit 600 in FIG. 6. Fast-transients are passed by capacitor 608 to the gates of transistors 612 and 616, while the gate of transistor 614 receives such transients through resistor 702. Thus, any rapid perturbation in the voltage potential between supply terminals 104 and 106 will imbalance current flow through transistors 612 and 616. Thus, the size of resistor 702, the sizes of transistors 612, 614, and 616, and the current sources 602, 604, and 606 may be controlled to provide a desired sensitivity to perturbations on the supply terminals 104 and 106.

While the illustrated embodiments of 600 and 700 included only a single EOS detection circuit 102, it should be appreciated that the circuits 600 and 700 may be implemented with multiple EOS detection circuits. In such an implementation, each of the EOS detection circuits may be configured to have a different detection threshold, making it possible to reliably detect a power event and to provide a signal indicative of detection of a power event to a storage element.

In the circuits 600 and 700 shown in FIGS. 6 and 7, capacitor 608 makes the EOS detection circuit 102 responsive to fast transient voltages as opposed to a slowly changing supply potential. However, in other embodiments, an analog-to-digital converter (ADC) can be configured to periodically sample the supply voltage, and logic can be implemented in hardware or software to look for a large difference between successive ADC samples, such a large difference can cause the circuit to generate an interrupt or set a status bit. While EOS detection using an ADC may be more expensive than implementing a capacitor, the ADC makes it easier for the EOS detection to be implemented in software. Other techniques for identifying fast-transients while ignoring slow-changing voltage potentials are also contemplated.

In the above-discussion of FIGS. 2, 4, 5, and 7, resistors are depicted as discrete circuit elements. However, it should be understood that such resistors may be implemented as adjustable impedance networks, which can be controlled or programmed to alter the impedance dynamically in order to provide a desired sensitivity. Further, in some instances, the programmable impedance may provide a complex impedance.

In an embodiment, a system may be provided that includes circuitry, which is sensitive to perturbations in a voltage potential between two terminals. Such circuitry can include capacitive-sensor circuitry (such as for a touch-screen or touch-pad type of human interface), a keypad, a voltage or current reference circuit, a receiver circuit, or other circuitry that can be impacted by such perturbations. The system may include ESD protection circuitry coupled to the two terminals to detect and provide protection from ESD events. The system may also include an EOS circuit coupled to the two terminals. The EOS circuit can be configured to detect an EOS event and to store data indicating detection of the EOS event in a data storage element, such as a register, a latch, or other storage element. The system may be part of an electronic device, such as a music player, a portable computer, a portable phone, or another electronic device.

While the above-discussion has focused on embodiments of EOS detection circuit 102, it should be appreciated that, regardless of the circuitry used to detect the EOS event, the resulting digital signal may be used in a variety of ways to prevent data corruption, to diagnose permanent damage, and so on. One possible method that can be implemented based on the EOS detection circuit is described below with respect to FIG. 8.

Figure 8:
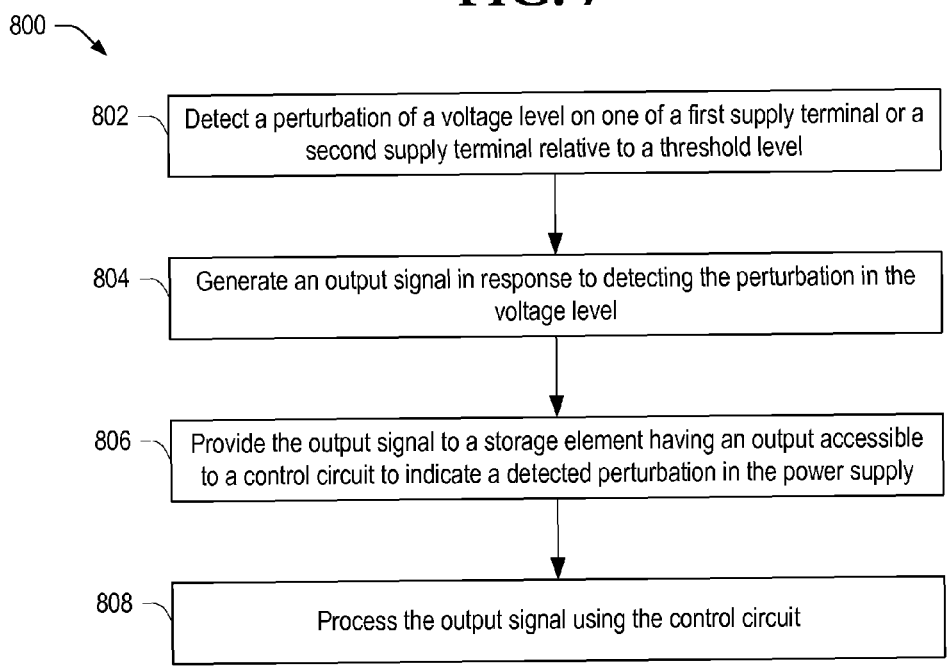
FIG. 8 is a simplified flow diagram of an embodiment of a method of detecting an EOS event using the EOS detection circuit of FIG. 1.

FIG. 8 is a flow diagram of an embodiment of a method 800 of detecting an EOS event using the EOS detection circuit of FIG. 1. At 802, a perturbation is detected in a voltage level on one of a first supply terminal or a second supply terminal relative to a threshold level. The threshold level may be based on a discrete circuit component, such as a diode, or may be based on a programmable circuit element, such as a programmable current source or an adjustable resistance. In some instances, the threshold level may also be based on appropriate sizing of transistors.

Advancing to 804, an output signal is generated in response to detecting the perturbation in the voltage level. The output signal may be a digital voltage level indicating a logic high voltage in a first state (such as a non-EOS state) and a logic low voltage in a second state (such as an EOS event detected state).

Continuing to 806, the output signal is provided to a storage element having an output accessible to a control circuit to indicate a detected perturbation in the power supply. Thus, storage element captures even fast, transient, EOS events, allowing time for the control circuit or system to notice the event and appropriately process the event. Moving to 808, the output signal (or register value) is processed by the control circuit or system. In an example, the control circuit is configured to investigate the source of the EOS event, to review and optionally discard recent data, to reset or recalibrate various components, or perform other operations in response to receiving the output signal indicating detection of the EOS event. In some instances, the control circuit or system may perform a diagnostic process to determine whether any permanent damage was sustained. Further, the control circuit may produce an output to a user interface or other system, providing a notification function to alert an administrator or operator.

In conjunction with the circuits and methods described above with respect to FIGS. 1-8, embodiments of an EOS detection circuit are described that are configurable to detect a perturbation in a voltage potential between power supply rails and/or between a supply terminal and a bond pad and to store a value in response to detecting the perturbation. The digital signal may be latched to provide time for a control circuit or system to process the signal. In some embodiments, the threshold at which a perturbation is detected may be related to a diode voltage drop. In other embodiments, the sensitivity of the EOS detection circuit is programmable, allowing for detection of extremely small perturbations.

Although the present invention has been described with reference to preferred embodiments, workers skilled in the art will recognize that changes may be made in form and detail without departing from the spirit and scope of the invention.

What is claimed is:

1. An electrical over-stress (EOS) circuit comprising:
a detector coupled to first and second supply terminals and configured to detect a perturbation in a supply voltage potential between the first and second supply terminals, the detector comprises:
a first diode including a first diode terminal coupled to the second supply terminal and a second diode terminal configured to couple to a bond pad;
a transistor having a first terminal, a control terminal, and a second terminal, the first terminal coupled to the first supply terminal, the control terminal coupled to the second supply terminal, and the second terminal configured to couple to the bond pad; and
an alert generator coupled to the first terminal of the transistor and configured to store data indicating an EOS event in response to the detection circuit detecting the perturbation.

2. The EOS circuit of claim 1, wherein the detector further comprises:
a second diode including a first diode terminal and a second diode terminal, the first diode terminal coupled to the bond pad, and the second diode terminal coupled to the first supply terminal.

3. The EOS circuit of claim 1, wherein the detector further comprises:

a resistor including a first terminal and a second terminal, the first terminal coupled to the bond pad, and the second terminal coupled to the second terminal of the transistor.

4. The EOS circuit of claim 1, wherein the detector detects the perturbation when a pad voltage on the bond pad varies by more than a pre-determined threshold relative to a supply voltage on the second supply terminal.

5. The EOS circuit of claim 1, further comprising:
a capacitor including a first electrode and a second electrode, the first electrode coupled to the bond pad, and the second electrode coupled to the first terminal of the transistor.

6. The EOS circuit of claim 1, further comprising:
a second transistor including a first terminal, a control terminal, and a second terminal, the first terminal coupled to the bond pad, the control terminal coupled to the first supply terminal, and the second terminal coupled to the second supply terminal.

7. The EOS circuit of claim 1, wherein the alert generator comprises:
a storage element including a data input and an output terminal, the data input coupled to the first terminal of the transistor, and the output terminal configurable to couple to a control circuit.

8. The EOS circuit of claim 1, wherein the detector comprises:
a plurality of detector circuits, each of the plurality of detector circuits comprising:
a current source including a first terminal and a second terminal, the first terminal coupled to the first supply terminal; and
a transistor including a first terminal, a control terminal, and a second terminal, the first terminal coupled to the second terminal of the current source, and the second terminal coupled to the second supply terminal.

9. The EOS circuit of claim 8, further comprising:
a capacitor including a first electrode and a second electrode, the first electrode coupled to the first supply terminal, and the second electrode coupled to the control terminal of the transistor of each of the plurality of detector circuits.

10. The EOS circuit of claim 8, wherein the plurality of detector circuits comprises:
a capacitor including a first electrode and a second electrode, the first electrode coupled to the first supply terminal;
a resistor including a first terminal and a second terminal, the first terminal coupled to the second electrode of the capacitor;
a first detector circuit including a first transistor having a first terminal, a control terminal, and a second terminal, the first terminal coupled to the first supply terminal, the control terminal coupled to the first terminal of the first transistor and to the second terminal of the resistor, and the second terminal coupled to the second supply terminal; and
at least one second detector circuit including at least one second transistor having a first terminal, a control terminal, and a second terminal, the first terminal coupled to the first supply terminal, the control terminal coupled to the first terminal of the resistor, and the second terminal coupled to the second supply terminal.

11. The circuit of claim 10, wherein the alert generation circuit comprises:
a storage device including a data input and an output terminal, the output terminal configured to couple to a control circuit; and
a logic circuit including at least one input coupled to the first terminal of the at least one second transistor and configured to logically combine data from the at least one input to provide a data value to the data input of the storage device.

12. A circuit comprising:
an electrostatic discharge (ESD) protection circuit for detecting a voltage potential that exceeds an ESD threshold between first and second supply terminals; and
an electrical over-stress (EOS) detector configured to detect a perturbation in the voltage potential that is greater than a pre-determined threshold and, in response to detecting the perturbation, store in a storage element data indicating an EOS event.

13. The circuit of claim 12, wherein the ESD threshold is greater than the predetermined threshold.

14. The circuit of claim 12, wherein the storage element comprises an output terminal configured to couple to a control circuit.

15. The circuit of claim 12, wherein the EOS detector comprises:
a first transistor including a first terminal, a control terminal, and a second terminal, the first terminal coupled to the first supply terminal, the control terminal coupled to the first terminal, and the second terminal coupled to the second supply terminal;
at least one second transistor comprising a first terminal, a control terminal, and a second terminal, the first terminal of the at least one second transistor coupled to the first supply terminal, the control terminal of the at least one second transistor coupled to the control terminal of the first transistor, and the second terminal of the at least one second transistor coupled to the second supply terminal; and
a capacitor having a first electrode and a second electrode, the first electrode coupled to the first supply terminal, and the second electrode coupled to the control terminal of the first transistor and at least one respective control terminal of the at least one second transistor.

16. The circuit of claim 15, wherein the EOS detector further comprises:
a resistor including a first terminal and a second terminal, the first terminal of the resistor coupled to the control terminal of the first transistor, and the second terminal of the resistor coupled to the second electrode of the capacitor and to the control terminal of a respective one of the at least one second transistor.

17. The circuit of claim 12, wherein the EOS detector comprises:
a transistor including a first terminal, a control terminal, and a second terminal, the first terminal coupled to the first supply terminal, and the control terminal coupled to the second supply terminal; and
a resistor including a first terminal and a second terminal, the first terminal of the resistor coupled to the second terminal of the transistor, and the second terminal of the resistor coupled to a bond pad.

18. A system comprising:
a first supply terminal;
a second supply terminal;
a circuit coupled between the first and second supply terminals, the circuit being sensitive to perturbations in a voltage potential between the first and second supply terminals;
an electrostatic discharge (ESD) protection circuit configured to detect an ESD event when the voltage potential between the first and second supply terminals exceeds an ESD threshold, the ESD protection circuit to shunt excess current between the first and second supply terminals and to clamp the voltage potential at a predetermined voltage level in response to detecting the ESD event; and an electrical over-stress (EOS) circuit including an EOS detector and a storage element, the EOS detector configured to detect a perturbation in the voltage potential that is greater than an EOS threshold and, in response to detecting the perturbation, to store in the storage element data indicating detection of an EOS event.

19. The system of claim 18, wherein the circuit comprises at least one of a sense circuit, a reference circuit, and a human interface circuit.

20. The system of claim 18, further comprising:
a control circuit coupled to the storage element and configured to process the data indicating detection of the EOS event, the control circuit to reset the storage element after processing the data.

21. The system of claim 18, wherein the ESD threshold is greater than the EOS threshold.

* * * * *